United States Patent
Jang et al.

(10) Patent No.: US 11,795,547 B2
(45) Date of Patent: Oct. 24, 2023

(54) METHOD OF AEROSOL DEPOSITION COATING FOR PLASMA RESISTANT COATING

(71) Applicant: KOMICO LTD., Anseong-si (KR)

(72) Inventors: Dae-Hoon Jang, Seoul (KR);
Hyunchul Ko, Anseong-si (KR);
Dong-Joo Kim, Yongin-si (KR);
Sang-Gyu Park, Anseong-si (KR);
Jin-Soo Park, Cheonan-si (KR)

(73) Assignee: KOMICO LTD., Anseong-si (KR)

( * ) Notice: Subject to any disclaimer, the term of this patent is extended or adjusted under 35 U.S.C. 154(b) by 170 days.

(21) Appl. No.: 16/614,515

(22) PCT Filed: Jul. 17, 2018

(86) PCT No.: PCT/KR2018/008072
§ 371 (c)(1),
(2) Date: Nov. 18, 2019

(87) PCT Pub. No.: WO2020/017671
PCT Pub. Date: Jan. 23, 2020

(65) Prior Publication Data
US 2021/0332481 A1    Oct. 28, 2021

(51) Int. Cl.
*C23C 24/04*    (2006.01)

(52) U.S. Cl.
CPC .................... *C23C 24/04* (2013.01)

(58) Field of Classification Search
CPC .. C23C 24/04; B05D 1/02; B05D 1/08; B05D 1/10; B05D 1/12
See application file for complete search history.

(56) References Cited

U.S. PATENT DOCUMENTS

| | | | |
|---|---|---|---|
| 6,086,686 A * | 7/2000 | Tanaka | C22C 38/001 |
| | | | 148/325 |
| 7,479,464 B2 | 1/2009 | Sun et al. | |
| 2001/0007714 A1* | 7/2001 | Gaboury | C09D 127/16 |
| | | | 524/502 |
| 2007/0111030 A1* | 5/2007 | Nakano | C23C 4/18 |
| | | | 428/701 |
| 2008/0003446 A1* | 1/2008 | Furukawa | B05D 7/14 |
| | | | 428/612 |

(Continued)

FOREIGN PATENT DOCUMENTS

JP    2008111154 A  *  5/2008
JP    2008111154 A      5/2008

(Continued)

OTHER PUBLICATIONS

Taiwan Search Report of 106117460, dated Sep. 29, 2020, English translation.

(Continued)

*Primary Examiner* — Alexander M Weddle
(74) *Attorney, Agent, or Firm* — STIP Law Group, LLC

(57) ABSTRACT

Disclosed is an aerosol-deposition-coating method for plasma-resistant coating, in which the inside of a processing device can be protected from plasma during a plasma-etching process, the roughness of a coating layer on a metal substrate can be decreased to thereby reduce the generation of particles, and adhesion between the coating layer and the metal substrate can be enhanced.

5 Claims, 3 Drawing Sheets

(56) References Cited

U.S. PATENT DOCUMENTS

| | | | | |
|---|---|---|---|---|
| 2013/0115418 A1* | 5/2013 | Young-Dohe | ............ | C23C 4/10 |
| | | | | 427/454 |
| 2013/0183488 A1* | 7/2013 | Liao | ........ | B32B 27/22 |
| | | | | 428/141 |
| 2014/0349073 A1* | 11/2014 | Sun | .................... | H01J 37/3244 |
| | | | | 428/432 |
| 2016/0362795 A1* | 12/2016 | Lee | ........ | C23C 24/04 |
| 2018/0142338 A1* | 5/2018 | Yokota | .................... | C23C 4/134 |

FOREIGN PATENT DOCUMENTS

| | | | | | |
|---|---|---|---|---|---|
| KR | 20110118939 A | | 11/2011 | | |
| KR | 101108692 B1 | | 1/2012 | | |
| KR | 101110371 | | 2/2012 | | |
| KR | 1020130123821 A | | 11/2013 | | |
| KR | 1020170080123 A | | 7/2017 | | |
| KR | 1020180129156 A | | 12/2018 | | |
| WO | WO-2017116130 A1 * | | 7/2017 | ............ | B32B 15/01 |

OTHER PUBLICATIONS

Taiwan Office Action of 106117460, dated Oct. 14, 2020, English translation.
International Search Report from Korean Intellectual Property Office of PCT/KR2018/008072, dated Apr. 15, 2019.

* cited by examiner

[Fig. 1]
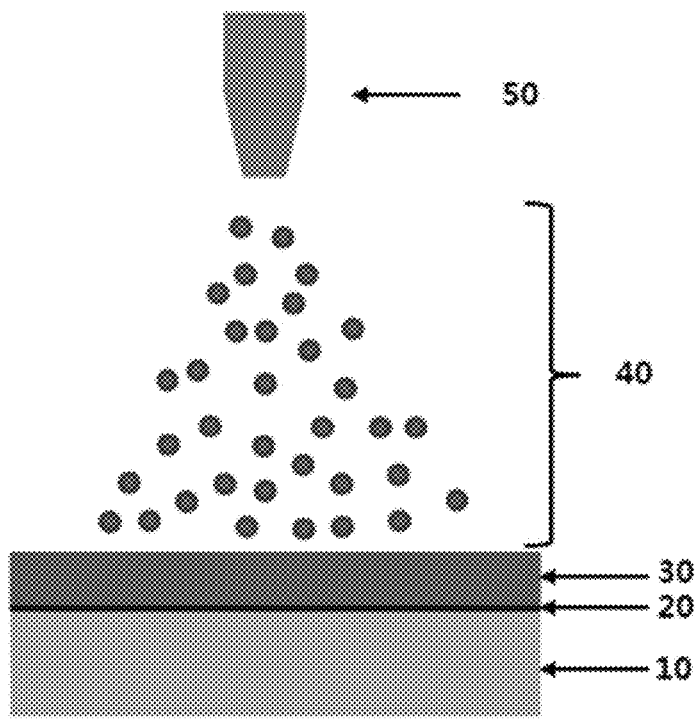
[Fig. 2]
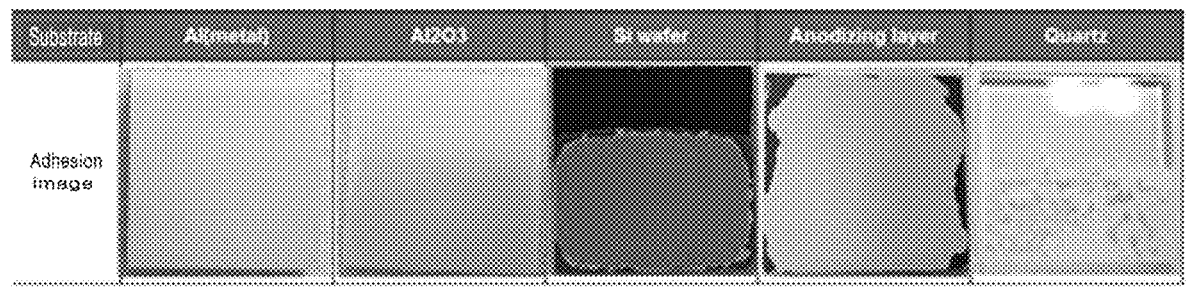

[Fig. 3]
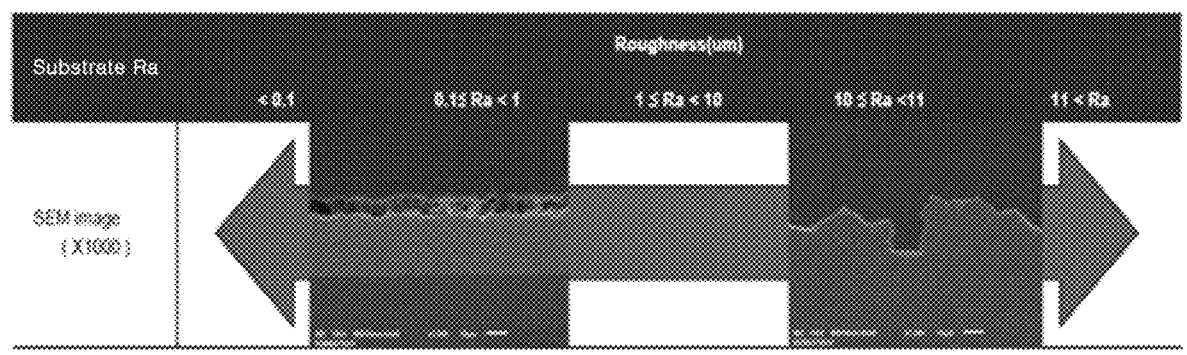
[Fig. 4]
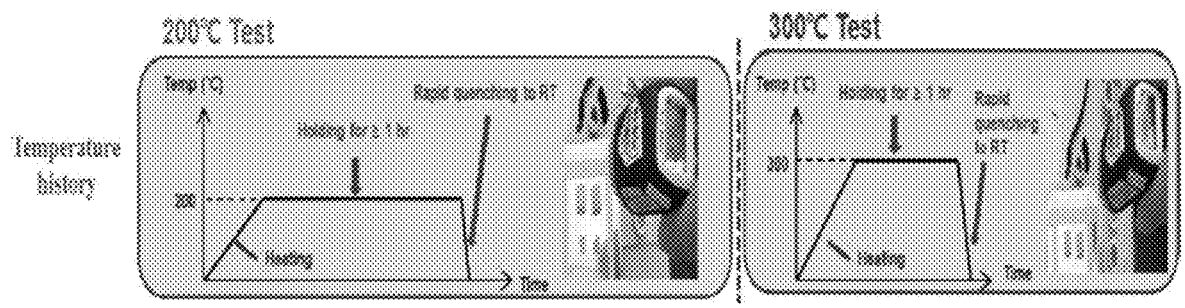

[Fig. 5]
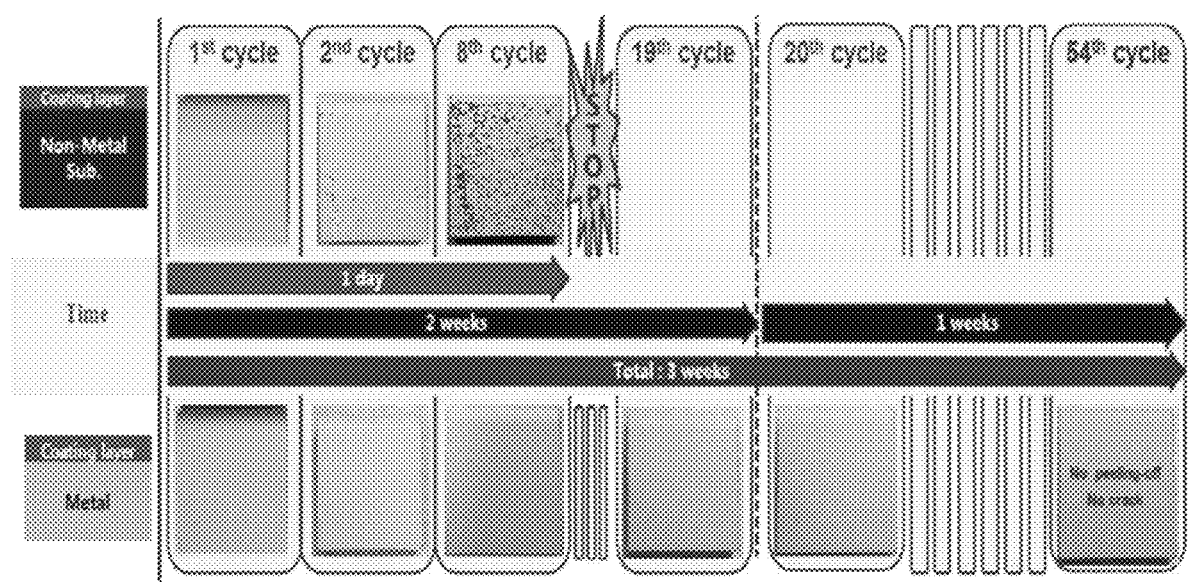

METHOD OF AEROSOL DEPOSITION COATING FOR PLASMA RESISTANT COATING

CROSS-REFERENCE TO RELATED APPLICATIONS

This application is the U.S. National Phase under 35 U.S.C. § 371 of International Application No. PCT/KR2018/008072 filed on Jul. 17, 2018, which in turn claims the benefit of Korean Application No. 10-2017-0064764, filed on May 25, 2017, the disclosures of which are incorporated by reference into the present application.

BACKGROUND OF THE INVENTION

1. Technical Field

The present invention relates to an aerosol-deposition-coating method for plasma-resistant coating, and more particularly to an aerosol-deposition-coating method for plasma-resistant coating, in which the inside of a processing device may be protected from plasma during a plasma-etching process, the roughness of a coating layer on a metal substrate may be decreased to thereby reduce the generation of particles, and adhesion between the coating layer and the metal substrate may be enhanced.

2. Description of the Related Art

In the fabrication of integrated circuit devices such as semiconductor devices, display devices, etc., an etching process or chemical vapor deposition (CVD) is performed in a high-density plasma environment. Accordingly, the etching process in a high-density plasma environment is carried out using an etching device having plasma-resistant parts.

During the etching process in a high-density plasma environment, ceramic materials such as rare earth oxides, aluminum nitride, and silicon oxide and anodizing-coated metal materials are applied to plasma-resistant parts.

However, in the recent fabrication of integrated circuit devices having a line width of about 20 nm or less, the etching process and the like are conducted in a higher-density plasma environment, and thus, required are plasma-resistant parts having superior plasma resistance and electrical insulating properties compared to a single spray-coated film or an anodizing-coated semiconductor part.

With the goal of solving the above problems, Korean Patent Application Publication No. 10-2013-0123821 (Nov. 13, 2013) discloses a plasma-resistant part including a first amorphous coating film formed through spray coating and a second coating film formed through an aerosol deposition process.

However, despite much effort to develop the plasma-resistant part as described above, the process using a corrosive gas or plasma during the manufacture of semiconductors is problematic because adhesion between the coating layer and the substrate may decrease and particles may be generated due to corrosion of the substrate.

Hence, there is a continuing need to develop techniques able to solve such problems.

CITATION LIST

Patent Literature (Patent Document 1) Korean Patent Application Publication No. 10-2013-0123821 (Nov. 13, 2013)

SUMMARY OF THE INVENTION

Accordingly, an objective of the present invention is to provide an aerosol-deposition-coating method for plasma-resistant coating, in which the inside of a processing device may be protected from plasma generated during a plasma-etching process, the roughness of a coating layer on a metal substrate may be decreased to thereby reduce the generation of particles, and adhesion between the coating layer and the metal substrate may be enhanced.

In order to accomplish the above objective, an aspect of the present invention provides an aerosol-deposition-coating method for plasma-resistant coating, the method including (a) removing impurities from a metal substrate and subjecting the surface of the metal substrate to mirror-surface finishing so that the surface roughness Ra of the metal substrate is less than 10 µm, (b) fixing the metal substrate facing a coating nozzle, and (c) forming a coating layer by spraying a transport gas and a coating powder onto the surface of the metal substrate using the coating nozzle.

In the present invention, the metal substrate may be at least one selected from among aluminum (Al) and stainless steel (SUS). Here, step (a) may further include washing the metal substrate, the surface of which has been subjected to mirror-surface finishing, and step (b) may further include vacuumizing the inside of the chamber of an aerosol-deposition-coating device.

Moreover, the coating powder may be at least one selected from the group consisting of an oxide, a fluorine compound, a nitride, yttrium oxide ($Y_2O_3$), and aluminum oxide ($Al_2O_3$), the coating layer formed in step (c) may have a thickness of 0.1 to 200 µm, and step (c) may further include washing the surface of the metal substrate that is coated.

Another aspect of the present invention provides a plasma-resistant coating layer formed by the method described above.

According to the present invention, the aerosol-deposition-coating method for plasma-resistant coating enables a plasma-resistant material to be provided in the form of a coating layer on a metal substrate, thereby protecting the inside of a processing device from plasma generated during a plasma-etching process, lowering the roughness of the coating layer on the metal substrate to thus reduce the generation of particles, and enhancing adhesion between the coating layer and the metal substrate against thermal shock.

BRIEF DESCRIPTION OF DRAWINGS

FIG. 1 schematically shows an aerosol-deposition-coating process;

FIG. 2 is images showing the adhesion of coating layers of Example 1 and Comparative Examples 1 to 4;

FIG. 3 shows scanning electron microscope (SEM) images of the coating layer depending on the roughness of the aluminum substrate;

FIG. 4 is a graph showing thermal shock measurement conditions of Example 1 and Comparative Example 3; and FIG. 5 shows the results of measurement of thermal shock of Example 1 and Comparative Example 3.

DESCRIPTION OF SPECIFIC EMBODIMENTS

Unless otherwise defined, all technical and scientific terms used herein have the same meanings as those typically understood by those skilled in the art to which the present invention belongs. Generally, the nomenclature used herein is well known in the art and is typical.

As used herein, when any part is said to "include" any element, this does not mean that other elements are excluded, and such other elements may be further included unless otherwise specifically mentioned.

The present invention pertains to an aerosol-deposition-coating method for plasma-resistant coating, the method including (a) removing impurities from a metal substrate and subjecting the surface of the metal substrate to mirror-surface finishing so that the surface roughness Ra of the metal substrate is less than 10 sum, (b) fixing the metal substrate facing a coating nozzle, and (c) forming a coating layer by spraying a transport gas and a coating powder onto the surface of the metal substrate using the coating nozzle.

Hereinafter, the method of the present invention is specified stepwise with reference to FIG. 1. FIG. 1 schematically shows the aerosol-deposition-coating process.

In step (a) of the aerosol-deposition-coating method for plasma-resistant coating according to the present invention, impurities are removed from the metal substrate and the surface 20 of the metal substrate 10 is subjected to mirror-surface finishing so that the surface roughness Ra of the metal substrate 10 is less than 10 μm.

The metal substrate 10 may include, but is not limited to, at least one selected from among aluminum (Al) and stainless steel (SUS).

Here, in the case of using a non-metal as the substrate, it is difficult to form a coating layer due to limitation of the maximum possible thickness of the coating layer, adhesion between the coating layer and the substrate may decrease, and separation of the coating layer and the substrate may be caused by thermal shock.

Furthermore, the surface roughness of the aerosol deposition coating layer 30, formed in the state in which the surface roughness of the metal substrate is high, may increase, and particles may be generated during the plasma-etching process. Hence, it is preferred that the surface of the metal substrate 10 be subjected to mirror-surface finishing.

The surface 20 may have Ra, which is one of surface roughness values, of less than 10 μm.

If Ra is 10 μm or more, the roughness Ra of the aerosol deposition coating surface may increase, and thus relative adhesion may decrease. Specifically, the formation of the coating layer having a non-uniform thickness may cause peeling due to the variation in coating layer thickness, whereby a peeling phenomenon occurs during processing using a corrosive gas or plasma, undesirably incurring product damage or shortening device life.

Meanwhile, the mirror-surface finishing serves to make the surface 20 of the metal substrate 10 smooth, and examples of the mirror-surface finishing include lapping, polishing, chemical mechanical polishing (CMP), grinding, abrasion, cutting, machining, and the like, but are not limited thereto.

Moreover, step (a) may further include washing the metal substrate, the surface of which has been subjected to mirror-surface finishing. The washing process is conducted to remove contaminants, impurities, dust, etc. from the metal substrate using air, water, a solvent, and the like, and is performed in a typical manner.

Subsequently, step (b) serves to fix the metal substrate so as to face the coating nozzle 50 of the aerosol-deposition-coating device, and the surface 20 subjected to mirror-surface finishing is fixed so as to face the coating nozzle 50 such that aerosol deposition may be easily performed.

As described above, the metal substrate may be fixed to the aerosol-deposition-coating device, and the inside of the chamber of the aerosol-deposition-coating device may be set in a vacuum. This is intended to generate a pressure difference between the aerosol chamber and the deposition chamber, in which the internal temperature of the chamber may be room temperature.

After completion of the preparation for aerosol deposition on the metal substrate, a transport gas and a coating powder are injected into the aerosol chamber. The transport gas may be an inert gas, which may include, but is not limited to, at least one selected from the group consisting of He, Ne, Ar and $N_2$.

Also, the coating powder may include, but is not limited to, at least one selected from the group consisting of an oxide, a fluorine compound, a nitride, yttrium oxide ($Y_2O_3$), and aluminum oxide ($Al_2O_3$).

In step (c), the transport gas and the coating powder 40 are sprayed onto the surface of the metal substrate using the coating nozzle 50, thereby forming a coating layer 30.

The thickness of the coating layer 30 may fall in the range of 1 to 200 μm. If the thickness of the coating layer is less than 1 μm, the effect of protecting the inside of the device from plasma may decrease. On the other hand, if the thickness of the coating layer exceeds 200 μm, economic benefits may be negated. Particularly, the thickness of the coating layer 30 may fall in the range of 1 to 100 μm.

Also, step (c) may further include washing the coated metal substrate, and the washing process may be the same as the washing process that may be carried out after mirror-surface finishing in step (a).

Therefore, the aerosol-deposition-coating method for plasma-resistant coating according to the present invention is capable of lowering the surface roughness of the coating layer 30 formed on the metal substrate 10, thereby reducing the generation of particles due to plasma to thus protect the inside of the device.

In addition, the present invention pertains to a plasma-resistant coating layer manufactured by the above method.

A better understanding of the present invention will be given through the following examples, which are merely set forth to illustrate the present invention but are not to be construed as limiting the scope of the present invention.

Example 1

First, yttrium oxide having an average particle size of about 30 μm was aerosolized using a powder vibrator in the chamber of an aerosol-deposition-coating device in a vacuum at room temperature. Thereafter, the aerosolized yttrium oxide powder was made to physically collide with an aluminum substrate, subjected to mirror-surface finishing so as to have a surface roughness Ra of less than 10 μm, together with a transport gas ($N_2$), at a rate of about 300 to 350 m/s using a pressure difference between the aerosol chamber and the deposition chamber, thereby forming a high-density yttrium oxide coating layer.

Comparative Examples 1 to 4

Respective coating layers were formed in the same manner as above, with the exception that the aluminum oxide ($Al_2O_3$) in Comparative Example 1, the Si wafer in Comparative Example 2, the aluminum anodizing layer in Comparative Example 3, and the quartz in Comparative Example 4 were used as the substrate.

<Test Example 1> Measurement of Coating Layer Thickness, Coating Deposition Amount, Roughness, and Uniformity The thickness of the coating layer formed in each of Example 1 and Comparative Examples 1 to 4 was determined by measuring a thickness difference using a roughness Ra meter made by Mitutoyo, and coating deposition amount, coating uniformity and roughness Ra were measured using a contact & non-contact meter (Mitutoyo roughness meter). Hardness was measured using a hardness meter (Vickers hardness meter). Here, the above test was repeated five times or more. The results are shown in Table 1 below.

TABLE 1

| No. | Formable coating layer thickness (μm) | Coating deposition amount (μm/pass) | Coating uniformity (%) | Roughness (μm) | Hardness (Hv) |
| --- | --- | --- | --- | --- | --- |
| Example 1 | >100 | 0.5~1 | 10 | <10 | >300 |
| Comparative Example 1 | <13~15 | 0.1~1 | 10 | <10 | >300 |
| Comparative Example 2 | <10~15 | 0.1~1 | 10 | <10 | >300 |
| Comparative Example 3 | <15~30 | 0.1~1 | 10 | <10 | >300 |
| Comparative Example 4 | <15~20 | 0.1~1 | 10 | <10 | >300 |

In Table 1, the formable coating layer thickness indicates the thickness of the coating layer, which causes a peeling phenomenon to occur during the coating process by repeating aerosol deposition coating on the substrate several times, and the coating uniformity indicates position-dependent variation in thickness of the coating surface after coating.

As is apparent from Table 1, in Example 1, using aluminum as the substrate, the coating layer was deposited at a thickness from 0.5 μm to 1 μm upon single aerosol coating (1 pass), and after repeating the aerosol coating, the coating layer was determined to be capable of being formed to a thickness of 100 μm or more.

In contrast, in Comparative Examples 1 to 4, using the non-metal substrate, the coating layer was deposited at a thickness from 0.1 μm to 1 μm upon single aerosol coating (1 pass), and after repeating the aerosol coating, the maximum possible thickness of the coating layer was determined to be less than about 10 to 30 μm, indicative of very difficult formation of the coating layer compared to Example 1.

Accordingly, the aerosol deposition coating, which is a physical deposition process, caused peeling of the coating layer from the non-metal substrate, making it difficult to form a coating layer. In particular, in the case in which the hardness or strength of the substrate is higher, as in the case of ceramics, it is difficult to form a coating layer using a coating powder on the substrate.

Meanwhile, the surface roughness of the coating layer was measured to be less than 10 μm, like the surface roughness of the substrate. The hardness of the coating layer was determined to be greater than 300 Hv regardless of the kind of substrate, and the coating uniformity was determined to be constant because the position-dependent variation in thickness of the coating surface fell within the range of 90 to 110%.

The results of adhesion of Example 1 and Comparative Examples 1 to 4 are shown in FIG. 2.

FIG. 2 shows images of the samples of Example 1 and Comparative Examples 1 to 4 imparted with a thickness of 10 to 20 μm at a film formation rate of about 1 sum/pass. As shown in FIG. 2, the aerosol deposition coating on the metal substrate exhibited good adhesion, whereas, in the case of the non-metal substrate, peeling occurred between the coating layer and the substrate.

<Test Example 2> Measurement of Changes in Thickness of Coating Layer Depending on Ra of Example 1

The aerosol coating was performed at different roughness values of the aluminum substrate as shown in Table 2 below. The thickness of the coating layer formed at each Ra was measured in the same manner as in Test Example 1. The results are shown in Table 2 below and in FIG. 3.

TABLE 2

| | Roughness (μm) | | | | |
| --- | --- | --- | --- | --- | --- |
| | Ra < 0.1 | 0.1 < Ra < 1 | 1 < Ra < 10 | 10 < Ra < 11 | 11 < Ra |
| Coating layer thickness | >100 μm | >100 μm | >100 μm | — | — |
| Coating layer formability | Coating layer formability | Coating layer formability | Coating layer formability | Peeling upon cumulative stacking of coating layer | Peeling upon cumulative stacking of coating layer |

As is apparent from Table 2, when the roughness of the metal substrate was less than 10 μm, the coating layer was determined to be capable of being formed to a thickness of 100 μm or more and a uniform coating resulted. When the roughness of the metal substrate was 10 μm or more, the coating layer peeled off, and moreover, due to the incomplete formation of the coating layer, the exact coating layer thickness could not be measured. Here, peeling may be caused by formation of a nonuniformly distributed coating layer from the beginning of the coating, or peeling may occur during repeated coating.

As shown in FIG. 3, when the roughness was less than 10 μm, the coating layer was uniformly formed at a coating thickness of about 20 μm. When the roughness was 10 μm or more, the surface of the substrate was not smooth, and thus it was confirmed that a nonuniform coating layer was formed from the beginning of the coating.

<Test Example 3> Measurement of Thermal Shock

After the formation of the coating layer having a thickness of 20 μm or less in Example 1 and Comparative Example 3, thermal shock was measured. Specifically, as shown in FIG. 4, the temperature was elevated from 0° C. to 200° C. or 300° C., followed by maintaining the elevated temperature for about 1 hr and then quenching. The results of measurement of thermal shock are shown in FIG. 5.

FIG. 5 shows the results of measurement of thermal shock in Example 1 (metal, Al) and Comparative Example 3 (non-metal, anodizing layer). As shown in FIG. 5, in Example 1, the coating layer did not peel even after 54 thermal shock measurement cycles, but in Comparative Example 3, the coating layer partially peeled from 2 thermal shock measurement cycles, and the coating layer peeled completely after 8 cycles.

Although the specific embodiments of the present invention have been disclosed for illustrative purposes with reference to the accompanying drawings, those skilled in the art will appreciate that various modifications are possible, without departing from the scope and spirit of the invention as disclosed in the accompanying claims. Therefore, the scope of the present invention will be defined by the accompanying claims and equivalents thereof.

What is claimed is:

1. An aerosol-deposition-coating method for plasma-resistant coating, the method comprising:
   (a) removing impurities from a metal substrate and subjecting a surface of the metal substrate to mirror-surface finishing so that a surface roughness (Ra) of the metal substrate is less than 10 μm, wherein the metal substrate is aluminum (Al);
   (b) fixing the metal substrate facing a coating nozzle; and
   (c) forming a coating layer by spraying a transport gas and a coating powder onto the surface of the metal substrate using the coating nozzle to form a coated metal substrate, wherein the coating layer formed in step (c) has a thickness of 100 to 200 μm and a surface roughness of 10 μm.

2. The aerosol-deposition-coating method of claim 1, wherein step (a) further comprises washing the metal substrate, the surface of which has been subjected to mirror-surface finishing.

3. The aerosol-deposition-coating method of claim 1, wherein step (b) further comprises vacuumizing an inside of a chamber of an aerosol-deposition-coating device.

4. The aerosol-deposition-coating method of claim 1, wherein the coating powder is at least one selected from the group consisting of an oxide, a fluorine compound, a nitride, yttrium oxide ($Y_2O_3$), and aluminum oxide ($Al_2O_3$).

5. The aerosol-deposition-coating method of claim 1, wherein step (c) further comprises washing a surface of the coated metal substrate.

* * * * *